US007330482B2

(12) United States Patent
Boumendil et al.

(10) Patent No.: US 7,330,482 B2
(45) Date of Patent: Feb. 12, 2008

(54) METHOD FOR PROCESSING DIGITAL SYMBOLS IN A COMMUNICATION SYSTEM AND TRANSMITTER AND RECEIVER FOR CARRYING OUT THE METHOD

(75) Inventors: Sarah Boumendil, Paris (FR); Evelyne Le Strat, Paris (FR); Bastien Massie, Paris (FR)

(73) Assignee: Alcatel Lucent, Paris (FR)

( * ) Notice: Subject to any disclaimer, the term of this patent is extended or adjusted under 35 U.S.C. 154(b) by 1068 days.

(21) Appl. No.: 10/327,799

(22) Filed: Dec. 23, 2002

(65) Prior Publication Data

US 2004/0085989 A1 May 6, 2004

(30) Foreign Application Priority Data

Dec. 26, 2001 (FR) .................... 01 16888

(51) Int. Cl.
*H04L 12/43* (2006.01)
(52) U.S. Cl. ...................... 370/458; 455/442
(58) Field of Classification Search .............. 370/442, 370/458, 347, 335, 342, 330; 455/442; 375/286
See application file for complete search history.

(56) References Cited

U.S. PATENT DOCUMENTS

| 5,029,185 | A | * | 7/1991 | Wei ........................... 375/245 |
| 5,729,538 | A | * | 3/1998 | Dent .......................... 370/347 |
| 5,841,749 | A | * | 11/1998 | Sako ....................... 369/59.26 |
| 6,163,766 | A | * | 12/2000 | Kleider et al. .............. 704/229 |
| 6,170,077 | B1 | * | 1/2001 | Lim et al. ................... 714/786 |
| 6,216,004 | B1 | * | 4/2001 | Tiedemann et al. ......... 455/442 |
| 6,259,685 | B1 | * | 7/2001 | Rinne et al. ................ 370/330 |
| 6,389,000 | B1 | * | 5/2002 | Jou ............................ 370/342 |

(Continued)

FOREIGN PATENT DOCUMENTS

EP    1 100 204    5/2001

(Continued)

OTHER PUBLICATIONS

Technical Specification 3G TS 25.212, << Multiplexing and channel coding (FDD), Release 1999 >>, version 3.7.0, published on Sep. 2001 by 3GPP (3rd Generation Partnership Project), ftp://ftp.3gpp.org/Specs/2001-09/R1999/25_series/25212-370.zip.

(Continued)

*Primary Examiner*—Thong Vu
(74) *Attorney, Agent, or Firm*—Sughrue Mion, PLLC (57) ABSTRACT

The digital symbols of a sequence are assigned to respective positions in successive timeslots, according to a predetermined slot format. In a plurality of timeslots, a symbol of the sequence is replaced by a substitution symbol carrying additional information. A signal representing the sequence of symbols, which is divided into the timeslots, is transmitted on a communication channel. The production of the sequence includes an interleaving having an interleaving period longer than a timeslot, generally performed after a channel coding. The position of the substitution symbols in the timeslots which include them is varied, in order to optimize the performances of the transmission chain.

39 Claims, 8 Drawing Sheets

U.S. PATENT DOCUMENTS

| | | | |
|---|---|---|---|
| 6,424,439 B1* | 7/2002 | King | 398/79 |
| 6,539,010 B1* | 3/2003 | Hagerman et al. | 370/347 |
| 6,567,388 B1* | 5/2003 | Tomcik et al. | 370/335 |
| 6,567,475 B1* | 5/2003 | Dent et al. | 375/286 |
| 7,058,035 B2* | 6/2006 | English | 370/332 |
| 2002/0061005 A1* | 5/2002 | Lee et al. | 370/342 |
| 2004/0001555 A1* | 1/2004 | Taffin et al. | 375/261 |
| 2005/0176435 A1* | 8/2005 | Fauconnier et al. | 455/450 |

FOREIGN PATENT DOCUMENTS

| | | |
|---|---|---|
| WO | WO 0101626 | 1/2001 |

OTHER PUBLICATIONS

Technical Specification TS 25.308, << High Speed Downlink Packet Access >>, Release 5, version 5.0.0, published on Sep. 2001 by 3GPP. ftp://ftp.3gpp.org/Specs/2001-09/Rel-5/25_series/25308-500.zip.

Valenti M C et al.: << A bandwidth efficient pilot symbol technique for coherent detection of turbo codes over fading channels >> Military Communications Conférence Proceedings, 1999. Milcom 1999. IEEE Atlantic City, NJ, USA Oct. 31-Nov. 3, 1999, Piscataway, NJ, USA, IEEE, US, Oct. 31, 1999, pp. 81-85, XP010369653.

* cited by examiner

| SLOT No. / FRAME No. | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 0 |   |   | 3 |   |   | 6 |   |   | 9 |   |   | 12 |   |   |
| 1 | 3 |   |   | 6 |   |   | 9 |   |   | 12 |   |   | 0 |   |   |
| 2 | 6 |   |   | 9 |   |   | 12 |   |   | 0 |   |   | 3 |   |   |
| 3 | 9 |   |   | 12 |   |   | 0 |   |   | 3 |   |   | 6 |   |   |

FIG. 9.

| SLOT No. / FRAME No. | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 0 |   |   | 3 |   |   | 6 |   |   | 9 |   |   | 12 |   |   |
| 1 | 1 |   |   | 4 |   |   | 7 |   |   | 10 |   |   | 13 |   |   |
| 2 | 2 |   |   | 5 |   |   | 8 |   |   | 11 |   |   | 14 |   |   |
| 3 | 3 |   |   | 6 |   |   | 9 |   |   | 12 |   |   | 15 |   |   |

METHOD FOR PROCESSING DIGITAL SYMBOLS IN A COMMUNICATION SYSTEM AND TRANSMITTER AND RECEIVER FOR CARRYING OUT THE METHOD

The present invention relates to digital transmissions and, more precisely, to the configuration of one or more streams of information symbols to be transmitted on one or more communication channels in a communication system supporting data interleaving mechanisms.

It is conventional in digital communication systems to protect the information to be transmitted against transmission errors by means of error detector and corrector codes. It is known that the decoding algorithms run by the receivers have optimum performances when the possible errors are dispersed in time. However, the phenomena introducing errors into the transmitted data are often such that the erroneous data are grouped in packets of errors. This is the case, for example, in radio channels experiencing the phenomenon of fading. The performances of the error detection and correction algorithms are then greatly reduced.

This is why interleaving mechanisms are often used. At the level of the transmitter, an interleaver permutes the information symbols to be transmitted over a certain time interval (interleaving period), the receiver being provided with a deinterleaver which performs the inverse permutation. Hence, if the transmitted datastream experiences a perturbation on the propagation channel with a duration shorter than the interleaving period, the errors which result therefrom in the information symbols are dispersed at the input of the decoder-corrector. This has the effect of limiting the effect of the errors on the performances of the detection and correction algorithms, and therefore on the perceived quality of the service being provided.

The invention relates to the techniques of stamping symbols in an interleaved sequence to be transmitted. The stamping consists in choosing certain symbols (binary or more generally M-ary, with M•2) in order to remove them from the sequence to be transmitted. The space thus freed on the physical channel being used to transmit the interleaved sequence can be used to transmit specific information, such as signaling information. In this case, a given communication channel is utilized for inserting information into it at the desired rate, without it being necessary to define other transmission resources for this information.

A problem arises, however, when it is desired to stamp a plurality of information symbols at regular intervals within an interleaving period. In view of the deterministic and dispersive nature of the interleaving operation, if a plurality of scattered symbols are stamped without particular precautions it is possible for the corresponding data sequence before interleaving, and therefore that obtained by the receiver after deinterleaving, to exhibit grouping of the stamped symbols.

Moreover, each stamped symbol constitutes a loss of information for the receiver, which cannot be compensated for by the error correction operations. If a plurality of stamped symbols are grouped after deinterleaving, the loss of information becomes large and the performances of the decoding are greatly impaired. This conflicts with the main aim of the interleaving. It may furthermore result in an imbalance between the transport channels multiplexed on the physical communication channel, in the event that, on a physical channel, the stamping eliminates information symbols coming from the same transport channel while other transport channels experience no stamping or little stamping, owing to the position of the symbols resulting from these transport channels on the physical channel after multiplexing.

It is an object of the present invention to improve this situation by allowing the transmission of additional information, for example signaling information, on current interleaved communication channels, without thereby degrading the performances of the transmission chain.

SUMMARY OF THE INVENTION

The invention therefore provides a method for digital communication, comprising the following steps:
producing a sequence of digital symbols;
assigning the symbols of the sequence to respective positions in successive timeslots, according to a predetermined slot format;
in a plurality of timeslots, replacing at least one symbol of the sequence by a substitution symbol carrying additional information; and
transmitting, on a communication channel, a signal representing the sequence of symbols which is divided into the timeslots.

According to the invention, the production of the sequence includes at least one interleaving having an interleaving period longer than a timeslot, and the position of the substitution symbols in the slots where symbols of the sequence are replaced is varied.

The production of the sequence generally includes a channel coding upstream of the interleaving. The variation of the position of the symbols may then follow a pattern chosen beforehand so that, as far as possible, the coded symbols corresponding, at the output of the channel coding, to the symbols replaced by the substitution symbols are not grouped. If the receiver performs operations which are the inverse of those which take place in the transmitter, in particular as regards the interleaving, this avoids grouping of the stamped signals within the datastream subjected to the channel decoding intended to correct the errors occurring on the communication channel.

A plurality of interleavers may be used and act over different periods, within a transmission interval made up of a plurality of frames and at the level of a frame, for example.

In a particular embodiment, the production of the sequence includes an interleaving operated at the scale of the frames, and each frame includes, before said interleaving, a plurality of groups of concatenated symbols respectively coming from different transport channels multiplexed on said communication channel, each of said transport channels having a respective interleaving period composed of an integer number of frames. The variation of the position of the substitution symbols within a frame then makes it possible to prevent the stamped symbols from belonging too systematically to the same transport channels.

The transmitted signaling information may contain an indication of one or more other communication channels to be read for a given receiver, although their reading is optional in normal time, which has the advantage of economizing on the resources of the receiver by making it work only when the information is actually addressed to it.

Some of the symbols carrying additional information may be transmitted with a higher transmission power than the other symbols being transmitted, so as to increase the reliability of their reception, particularly when these substitution signals are transmitted without redundancy.

The invention also provides a transmission device for a digital communication system, comprising:

means for production of a sequence of digital symbols;

means for assignment of the symbols of the sequence to respective positions in successive timeslots, according to a predetermined slot format;

substitution means for replacing, in a plurality of timeslots, at least one symbol of the sequence by a substitution symbol carrying additional information; and means for transmission, on a communication channel, of a signal representing the sequence of symbols which is divided into the timeslots.

The means for production of the sequence include at least one interleaver having an interleaving period longer than a timeslot. The substitution means are designed to vary the position of the substitution symbols in the slots where symbols of a digital sequence are replaced.

The invention lastly provides a reception device for a digital communication system, comprising:

means for reception, on a communication channel, of a signal representing a digital sequence of symbols which is divided into successive timeslots;

means for extraction of additional information from only part of the timeslots, by reading at least one respective symbol carrying additional information in each of the timeslots of said part; and means for processing of the sequence of symbols which is stripped of the symbols carrying additional information, the processed symbols being obtained at defined positions in the timeslots according to a predetermined slot format.

The means for processing of the sequence include at least one deinterleaver having a deinterleaving period longer than a timeslot. The extraction means are designed to read said symbols carrying additional information at variable positions from one slot to another slot in said part.

Other features and advantages of the present invention will become apparent from the following description of nonlimiting exemplary embodiments, with reference to the appended drawings.

DESCRIPTION OF PREFERRED EMBODIMENTS

In the present description, the invention will be described more particularly in its nonlimiting application to third-generation radiocommunication networks of the UMTS type ("Universal Mobile Telecommunication System") in FDD mode ("Frequency Division Duplex").

UMTS is a radiocommunication system using code-division multiple access (CDMA), that is to say the transmitted symbols are multiplied by spreading codes consisting of samples called "chips", whose rate (3.84 Mchips/s in the case of UMTS) is higher than that of the transmitted symbols. The spreading codes distinguish various "Physical CHannels" PhCH which are superposed on the same transmission resource consisting of a carrier frequency. The auto- and cross-correlation properties of the spreading codes allow the receiver to separate the PhCHs and to extract the symbols which are intended for it. For UMTS in FDD mode on the downlink, a scrambling code is allocated to each base station, and different physical channels used by this base station are distinguished by mutually orthogonal "channelisation" codes. For each PhCH, the global spreading code is the product of the "channelisation" code and of the scrambling code of the base station. The spreading factor (equal to the ratio between the chip rate and the symbol rate) is a power of 2 lying between 4 and 512. This factor is chosen as a function of the speed of symbols to be transmitted on the PhCH.

Figure 1:
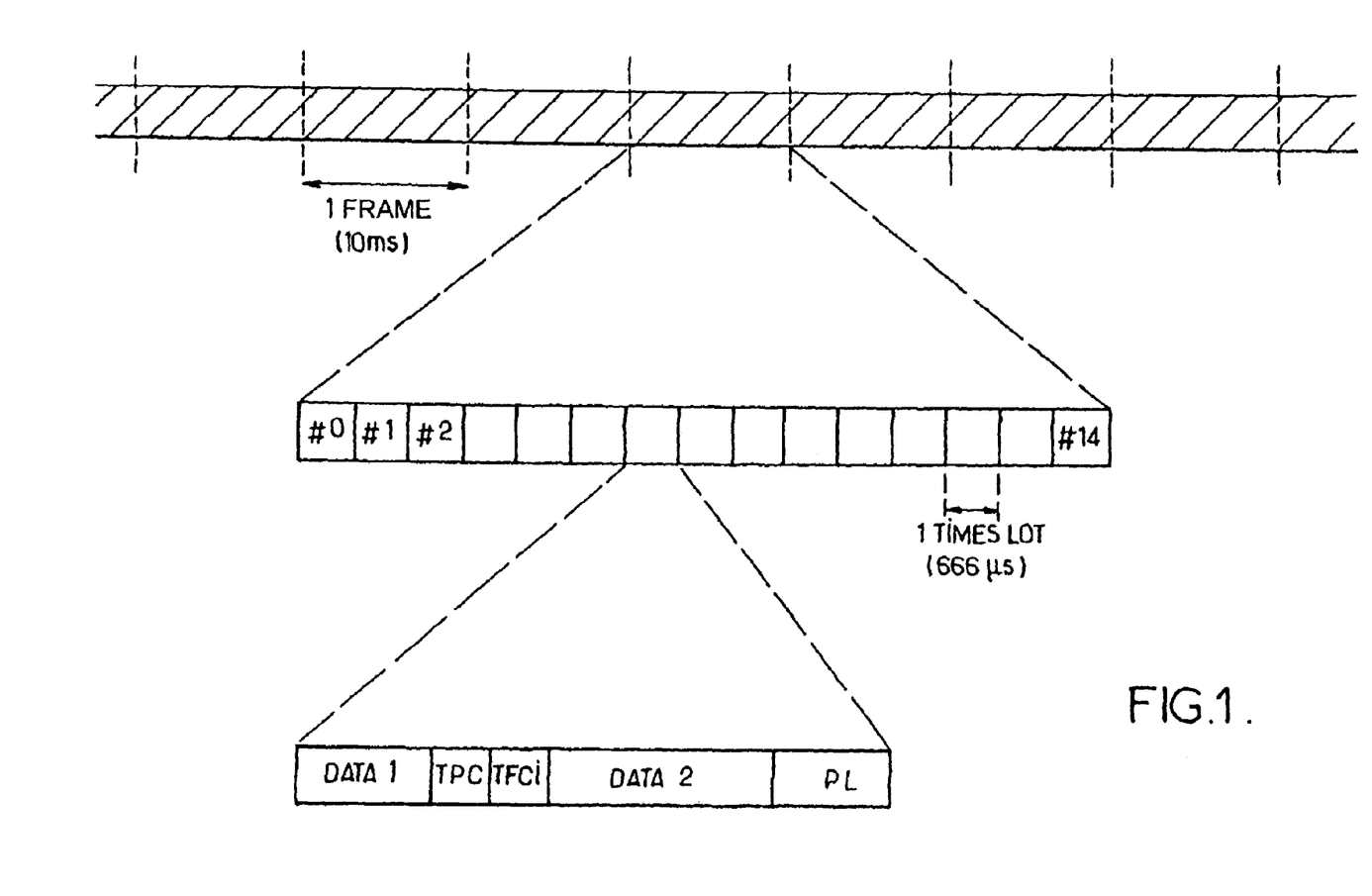
FIG. 1 is a diagram illustrating the frame structure employed on the downlinks in the UMTS system in FDD mode.

The various physical channels comply with a frame structure illustrated by FIG. 1. The frames of 10 ms follow one another on the carrier frequency used by the base station. Each frame is subdivided into N=15 "timeslots" of 666 µs. Each slot may carry the superposed contributions of one or more physical channels, comprising common channels and dedicated channels DPCH ("Dedicated Physical CHannel"). The lower diagram in FIG. 1 illustrates the contribution of a downlink DPCH to a timeslot in FDD mode, which includes:

a certain number of pilot symbols PL. Known are priori by the terminal, these symbols PL allow it to acquire the synchronization and to estimate parameters useful for the demodulation of the signal;

a "Transport Format Combination Indicator" TFCI;

a "Transmit Power Control" TPC to be used by the terminal on the uplink; and two data fields, denoted DATA1 and DATA2, placed on either side of the field TPC.

The DPCH may also be regarded as combining a. "Dedicated Physical. Control CHannel", or DPCCH, corresponding to the fields TFCI, TPC and PL, and a "Dedicated Physical Data CHannel", or DPDCH, corresponding to the fields DATA1 and DATA2.

The modulation used on the DPCH channel is "Quadrature Phase Shift Keying" (QPSK). The symbol sequences subjected to the modulator are therefore composed of quaternary symbols, each consisting of the combination of two bits.

It is possible, for the same communication, to establish a plurality of DPCHs corresponding to different "channelisation" codes, whose spreading factors may be equal or different. This situation is encountered, in particular, when one DPDCH is not enough to provide the transmission speed required by the application. The number, equal to or greater than 1, of physical downlink channels used for a given communication from a base station will be denoted below as Y.

Furthermore, this same communication may use one or more "Transport CHannels" TrCH. Multiplexed TrCHs are typically used for multimedia transmissions, in which signals of different natures to be transmitted simultaneously require different transport characteristics, especially concerning protection against transmission errors. Certain coders may also, in order to represent a given signal (for example an audio signal), deliver a plurality of symbol streams having different perceptual importances and therefore requiring different degrees of protection. Multiple TrCHs are then used to transport these various symbol streams. The number, equal to or greater than 1, of transport channels used for a given communication on the aforementioned Y physical channels will be denoted below as X.

For each transport channel i ($1 \leq i \leq X$), a "Transmission Time Interval" TTI composed of $F_i$ consecutive frames, with $F_i=1, 2, 4$ or $8$, is defined. Typically, a commensurately shorter TTI is used when the signal conveyed by the transport channel needs to be received with a short delay. For example, a TTI of 20 ms ($F_i=2$) will be used for a telephony application, while a TTI of 80 ms ($F_i=8$) may be used for a data transmission application.

The multiplexing of the X information symbol streams coming from the TrCHs on the Y PhCHs is described in detail in the technical specification 3G TS 25.212, "Multiplexing and channel coding (FDD), Release 1999", version 3.7.0, published in September 2001 by the 3GPP (3$^{rd}$ Generation Partnership Project).

Figure 2:
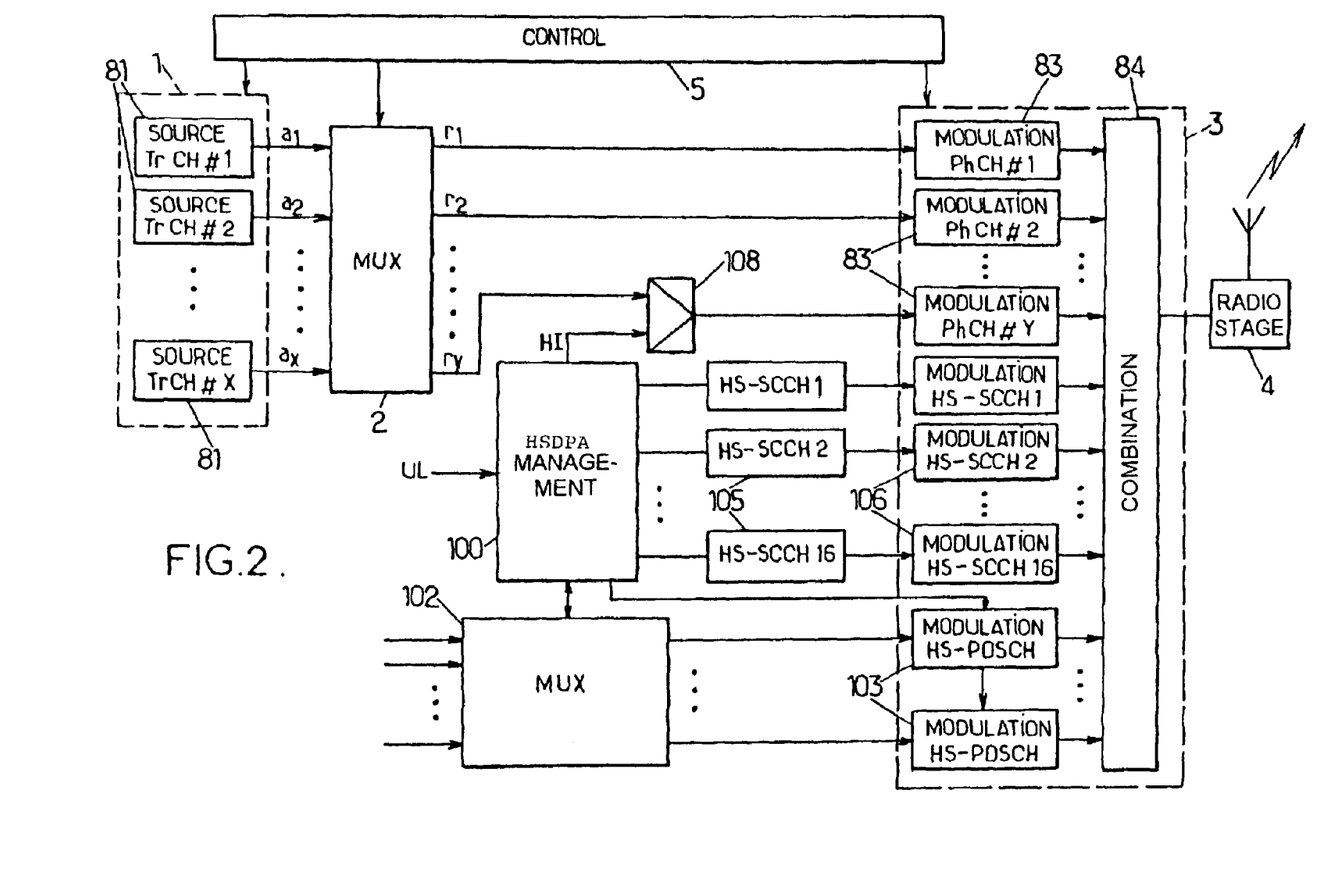
FIGS. 2 and 3 are block diagrams of a base station and of a UMTS terminal to which the invention can be applied, in the context of the HSDPA functionality ("High Speed Downlink Packet Access")

FIG. 2 schematically illustrates the transmission part of a UMTS base station functioning in FDD mode. The block 1 denotes as a whole the sources 81 respectively delivering information symbol streams $a_i$ ($1 \leq i \leq X$) relating to the X TrCHs used in a communication on dedicated resources between the base station and a terminal.

The block 2 multiplexes the streams $a_i$ in order to form what is referred to as a "Coded Composite Transport CHannel", or CCTrCH, which is then subdivided into one or more physical channels PhCH#j ($1 \leq j \leq Y$) on which synchronized symbol streams respectively denoted $r_j$ are transmitted.

The block 3 denotes the circuits which modulate the streams $r_j$ and combine them in order to form a signal, which is processed by the radio stage 4 before being transmitted over the air interface. The block 3 carries out the spreading, by the "channelisation" codes assigned to the PhCHs, of each of the streams $r_j$ (modules 83), as well as of the additional streams optionally delivered for other communications being supported at the same time by the base station, the various symbol streams spread in this way subsequently being summed then multiplied by the scrambling code of the base station (module 84). The sequencing and the parameterization of the blocks 1, 2, 3 is performed by a control unit 5 according to the parameters defined for the base station and for the communication in question.

Figure 3:
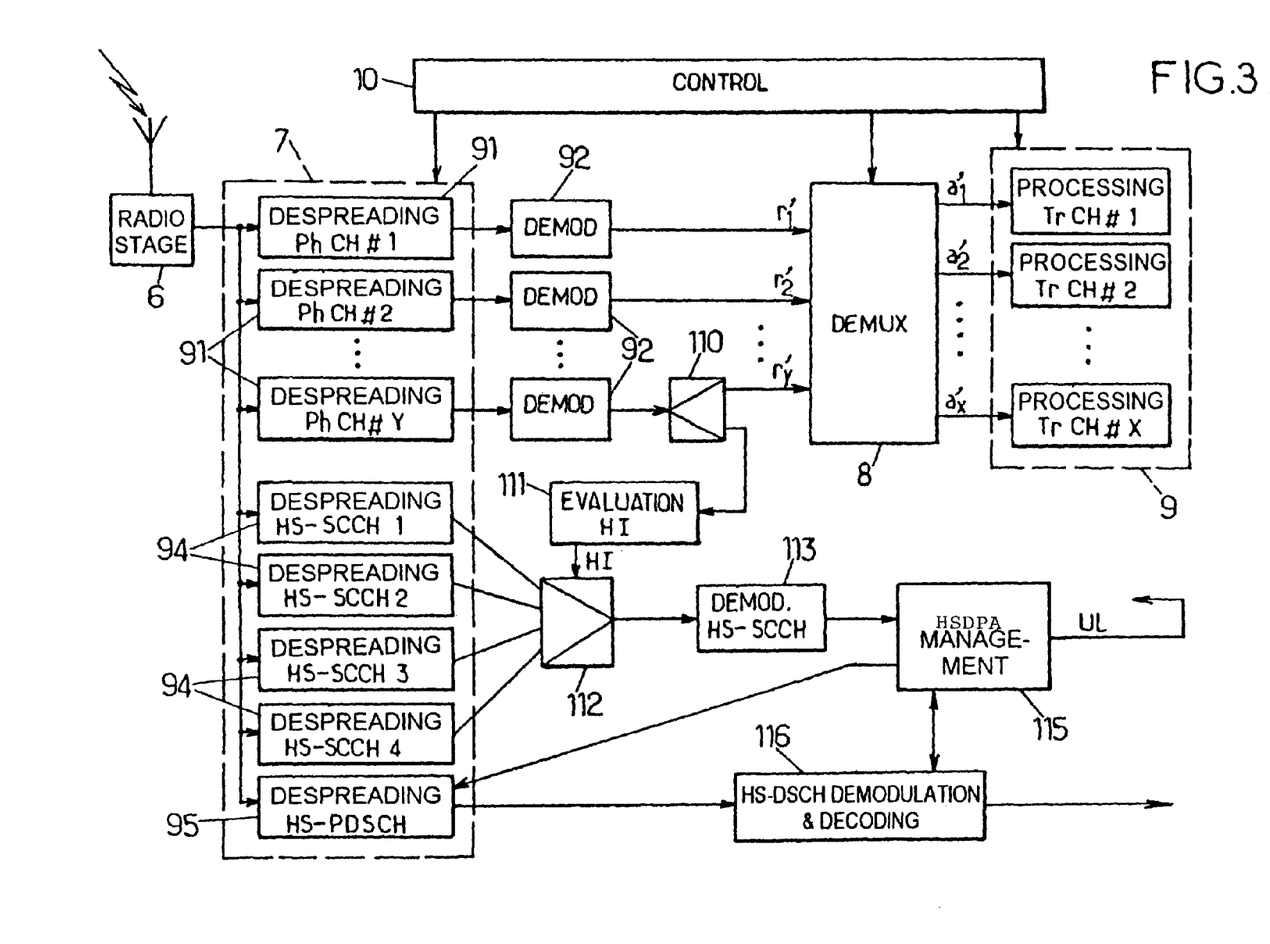

FIG. 3 schematically illustrates the reception part of a UMTS terminal communicating in FDD mode with a base station according to FIG. 2. The block 7 include modules 91 (adapted filters) for despreading the baseband signal restored by the radio stage 6 from the signal picked up by the antenna of the terminal, by using the scrambling code of the base station and the Y respective "channelisation" codes assigned to the terminal. For each of the Y physical channels j ($1 \leq j \leq Y$), a module 92 demodulates the despread signal in order to deliver respective data $r'_j$ representing estimates of the symbols of the stream $r_j$ formed at the level of the base station.

In the event that the symbols are bits, the estimates $r'_j$ are "softbits", that is to say digital values whose sign characterizes the estimated bit and whose absolute value represents the likelihood of this estimate.

The Y datastreams $r'_j$ are provided to a demultiplexing block 8 which performs the inverse operations of the multiplexer 2 of the base station. For each transport channel i ($1 \leq i \leq X$), this block 8 delivers a stream $a'_i$ of estimates (softbits or hardbits) of the symbols of the stream $a_i$. These estimates $a'_i$ are provided to the processing circuit of the TrCH i belonging to the block 9. The sequencing and the parameterization of the blocks 7, 8, 9 is provided by a control unit 10 of the terminal.

As is usual in the field of digital radiocommunications, the blocks 1-3, 5 of the base station and 7-10 of the terminal may be produced by programming one or more digital signal processors, and/or by using specific logic circuits.

Figure 4:
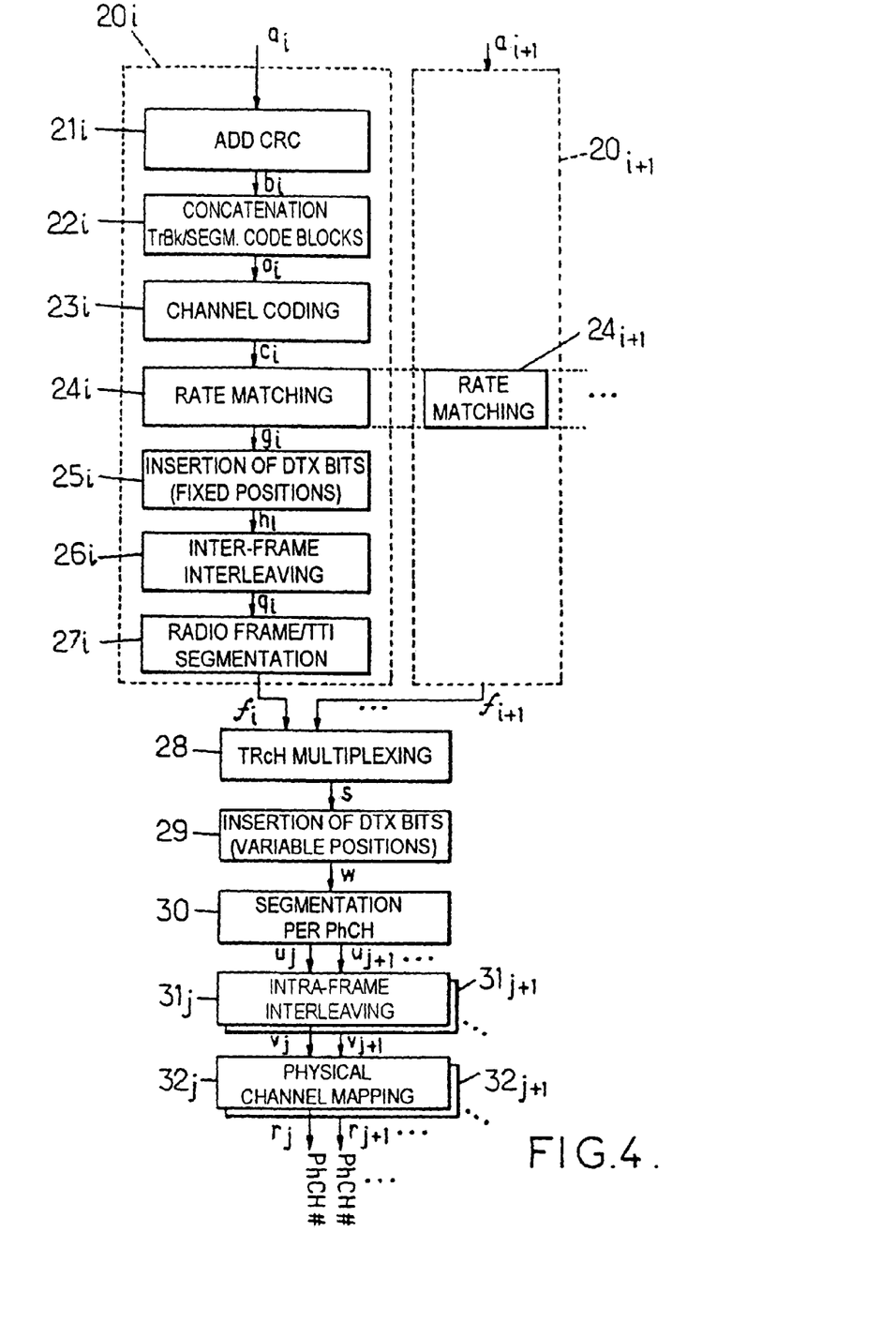
FIGS. 4 and 5 are block diagrams of the multiplexing and demultiplexing blocks of the base station and of the terminal according to FIGS. 2 and 3.
Figure 5:
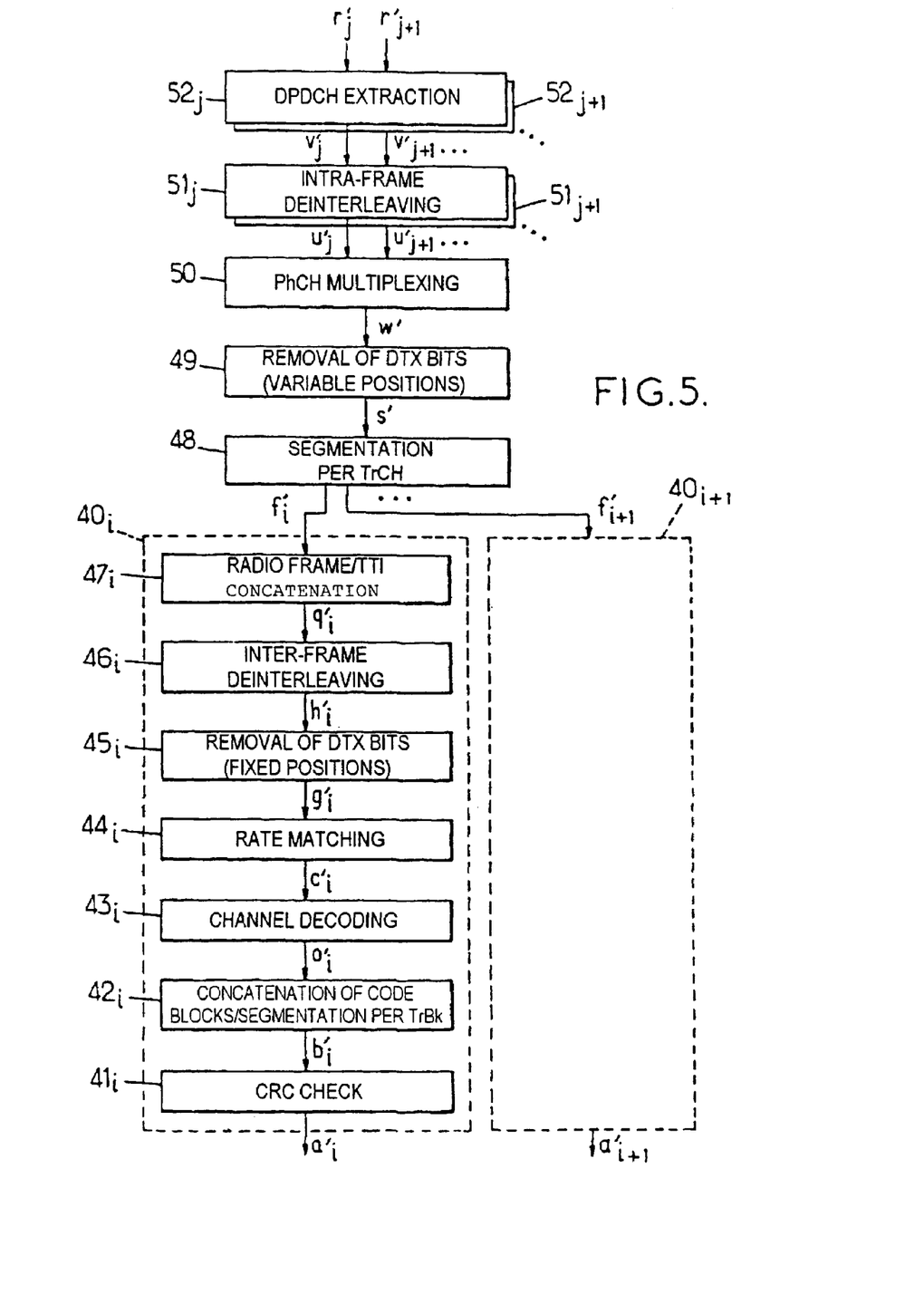

FIGS. 4 and 5 respectively detail the various functional modules of the multiplexing 2 and demultiplexing 8 blocks (see the aforementioned specification 3G TS 25.212). In these figures, the references bearing the index i ($1 \leq i \leq X$) denote the elements relating to the TrCH i (blocks 20$_i$ and 40$_i$), the references bearing the index j denote the elements relating to the PhCH j ($1 \leq j \leq Y$), and the references without any index relate to the operations performed for each frame at the CCTrCH level.

The stream $a_i$ to be transmitted on each TrCH i is composed of binary symbols delivered in the form of successive "transport blocks" TrBk. The module 21$_i$ completes each TrBk by adding to it a cyclic redundancy code CRC which is used to detect possible transmission errors. The TrBks $b_i$ are then concatenated and/or segmented by the module 22$_i$ in order to form blocks $o_i$ with a size suitable for the input of the channel coder 23$_i$.

For each TTI of the transport channel i, the channel coder 23$_i$ delivers a sequence $c_i$ of $E_i$ coded bits denoted $c_{i,m}$ ($1 \leq m \leq E_i$). Two types of error corrector code may be applied by the module 23$_i$:

- a convolution code with efficiency ½ or ⅓ and with constraint length K=9;
- a turbocode with efficiency ⅓ for applications requiring the lowest error levels. In this case, the bits $c_{i,3p+q}$ of the output sequence of the coder are systematic bits (copies of the input blocks $o_i$) if q=1, and parity bits if q=2 or 0.

The "rate matching" modules 24$_i$ eliminate (stamp) or repeat bits of the sequences $c_i$ in order to match the bit rate of the TrCHs to the overall rate allowable on the PhCH or PhCHs in view of their spreading factors. For each TTI on the TrCH i, the information provided by the upper layers of protocol is used to define a parameter $\Delta N_i^{TTI}$ which is negative in the case of stamping and positive in the case of repetition. The sequence $g_i$ produced by the module 24$_i$ for the TTI is composed of $G_i = E_i + \Delta N_i^{TTI}$ bits denoted $g_{i,n}$ ($1 \leq n \leq G_i$). In the event that the module 23$_i$ has used a turbocode, the stamping applied by the module 24$_i$ if $\Delta N_i^{TTI} < 0$ is limited to the parity bits in view of the greater importance of the systematic bits for the decoder.

In a given frame, the periods given over to the various TrCHs of the communication may have fixed positions (before the intra-frame interleaving mentioned below) or variable positions. In the case of fixed positions, it may be necessary to add to the sequence $g_i$, by means of the module 25$_i$, one or more marked symbols which will not be transmitted (the value of the corresponding bit will, for example, be set to zero instead of $\pm 1$ in the output stream $r_j$ including such a symbol, so that the transmission power of the symbol is zero). "δ" denotes the DTX ("Discontinuous Transmission") bits marked in this way. In the implementation example considered here without implying any limitation, each symbol $h_{i,n}$ of the sequence $h_i$ delivered by the module $25_i$ ($0 \leq n \leq F_i.H_i$, with $G_i \leq F_i.H_i$) is represented by two bits:

$h_{i,n}=(0, g_{i,n})$ if $n \leq G_i$;

$hi,n=(1, 0)$ if $G_i < n \leq F_i.H_i$ (marked bits "$\delta$").

The interleaving module $26_i$ performs a permutation of the sequence $h_i$, with a view to distributing the symbols pertaining to the TTI over the $F_i$ frames which it covers. This inter-frame interleaving (if $F_i>1$) consists in successively writing the symbols of the sequence $h_i$ into the rows of a matrix including $F_i$ columns, in permuting the columns of the matrix, then in reading the symbols of the matrix column by column in order to form the sequence denoted $q_i$. The module $27_i$ then separates the sequence $q_i$ into $F_i$ segments of consecutive symbols corresponding to the $F_i$ columns of the interleaving matrix after permutation, and respectively assigns these segments to the $F_i$ frames of the TTI in order to form a sequence denoted $f_i$ for each frame and each TrCH i ($1 \leq i \leq X$).

According to the specification 3G TS 25.212, the column permutation performed by the inter-frame interleaver $26_i$ is such that the n-th symbol $h_{i,n}$ of the TTI, with $n=(\alpha-1).F_i+\beta$, $\alpha$ and $\beta$ being integers such that $1 \leq \alpha \leq R1$ and $1 \leq \beta \leq F_i$, is located at the $\alpha$-th position in the $\gamma$-th frame of the TTI, i.e.:

$h_{i,n}=q_{i,n'}$ with $n'=(\gamma-1).R1+\alpha$ (1)

where R1 denotes the smallest integer such that $R1 \times F_i$ is at least equal to the number $X_i$ of bits of the current frame ($X_i \leq R1 \times F_i$), and $\gamma$ is a frame index defined by the integer $\beta$ according to the permutation: $\gamma-1=BR(n-1, F_i)=BR(\beta-1, F_i)$. The number $BR(x, 2^y)$ is defined here as the integer whose representation in base 2 corresponds to reading in the opposite direction the representation in base 2 over y digits of the remainder of the Euclidian division of x by $2^y$ (for example, $BR(51, 8)=BR(3, 8)=BR([011]_2, 2^3)=[110]_2=6$).

The sequences $f_i$ produced for the various TrCHs of the communication ($1 \leq i \leq X$) are multiplexed, that is to say placed one after the other, by a module 28 forming a sequence s of S symbols for the CCTrCh. In the event that the periods given over to the various TrCHs of the communication have variable positions, it may be necessary to add to the sequence s, by means of the module 29, one or more symbols marked "$\delta$". In the implementation example considered here, each symbol $w_k$ of the sequence w delivered by the module 29

$(1 \leq k \leq \sum_{j=1}^{Y} U_j,$ with $S \leq \sum_{j=1}^{Y} U_j$ and $U_j$ equal to the number of bits per frame on the DPDCH of the physical channel j, which number depends on the spreading factor allocated to the channels) is represented by two bits:

- $w_k = (0, s_k)$ if $k \leq S$;

- $w_k = (1, 0)$ if $S < k \leq \sum_{j=1}^{Y} U_j$.

The module 30 then separates the sequence w into Y segments of $U_1, U_2, \ldots, U_Y$ consecutive symbols, and respectively assigns these segments to the Y PhCHs in order to form a sequence denoted $u_j$ for each PhCH j ($1 \leq j \leq Y$). The interleaving module $31_j$ performs a permutation of the sequence $u_j$, with a view to distributing the symbols, within the current frame, over the Y PhCHs employed by the communication. This interleaving consists in successively writing the symbols of the sequence $u_j$ into the rows of a matrix including $C2=2 \times N=30$ columns, in permuting the columns of the, matrix, then in reading the symbols of the matrix column by column in order to form the sequence of $U_j$ symbols denoted $v_j$.

The "physical channel mapping" module $32_j$ finally distributes the successive symbols of the sequence $v_j$ into the fields DATA1 and DATA2 of the timeslots of the current frame. The module 32j can translate the information bits with the values 0 or 1 into signed bits ($\pm 1$), and assign the value 0 to the marked bits "$\delta$". It furthermore completes the stream $r_j$ addressed to the block 3 by inserting the appropriate signaling bits into the fields PL, TFCI and TPC of the DPCCH.

According to the specification 3G TS 25.212, if R2 denotes the smallest integer such that $R2 \times C2$ is at least equal to the number $U_j$ of bits of the current frame ($U_j \leq R2 \times C2$), the column permutation performed by the intra-frame interleaver $31_j$ is such that the n-th symbol $u_{j,n}$ of the current frame, with $n=(\alpha-1).C2+\beta$, $\alpha$ and $\beta$ being integers such that $1 \leq \alpha \leq R2$ and $1 \leq \beta \leq C2=2 \times N$, is located at the $(\epsilon.R2+\alpha)$-th position in a $\gamma$-th timeslot of the frame, i.e.:

$u_{j,n}=v_{j,n'}$ with $n'=2.(\gamma-1).R2+\epsilon.R2+\alpha$ (2)

where $\epsilon=0$ or 1 and $2.(\gamma-1)+\epsilon$ is an integer obtained as a function of $\beta-1$ by a determined permutation $perm_{C2}$ over the integers contained between 0 and C2-1: $2.(\gamma-1)+\epsilon=perm_{C2}(\beta-1)$.

The demultiplexing block 8 of the terminal includes modules which perform, in the opposite direction, the dual operations of the modules $20_i$-$32_j$ of the multiplexing block 2 of the base station. In FIG. 5, the primed references correspond to the estimates of the symbols bearing the same references which are not primed in FIG. 4. For the symbols composed of two bits formated as indicated above, because of the marking of the "$\delta$" bits, these estimates (softbits) relate to the least significant bit.

For each frame of 10 ms and each PhCH, the module 52j extracts from the fields DATA1 and DATA2 of the demodulated signal the sequence $v'_j$ of $U_j$ softbits pertaining to the DPDCH. The deinterleaving module $51_j$ applies the inverse permutation of the module $31_j$ to this sequence $v'_j$ in order to restore the sequence of softbits $u'_j$. The Y sequences $u'_j$ are placed end to end by the multiplexing module 50 in order to form the sequence of softbits w' relating to the CCTrCH. In the event that the TrCHs have variable positions, the module 49 removes the last $$\sum_{j=1}^{Y} U_j - S$$

softbits of the sequence w', which correspond to "δ" bits. The sequence of softbits s' which is produced by the module 49 is separated by the segmentation module 49 into X subsequences f'$_i$ respectively assigned to the TrCHs.

For each TrCH i whose TTI includes a plurality of frames (F$_i$>1), the module 47$_i$ concatenates the subsequences produced in relation to the various frames, in order to form the sequence q'$_i$ which is subjected to the inter-frame deinterleaving module 46$_i$. The latter operates the inverse permutation of the module 26$_i$ in order to restore the sequence of softbits h'$_i$. In the event that the TrCHs have fixed positions, the module 45$_i$ removes the F$_i$.H$_i$−G$_i$ last softbits of the sequence h'$_i$, which correspond to "δ" bits. The sequence of softbits s' produced by the module 49 is then processed by the rate matching module 44$_i$, which performs the following operations:

insertion of a zero softbit (minimum likelihood) instead of each bit which was stamped at transmission;

re-evaluation of each softbit corresponding to a bit which has been repeated, in order to refine its likelihood.

The output sequence c'$_i$ of the module 44$_i$ is decoded by the module 43$_i$ in order to correct possible transmission errors. The symbols of the decoded blocks o'$_i$ delivered by the module 43$_i$ may be softbits, or hardbits if the likelihood measurements are no longer necessary in the subsequent processing operations. On the basis of these blocks o'$_i$, the module 42$_i$ reconstructs the estimated TrBks b'$_i$, and the module 41$_i$ checks the integrity of the CRC in order to validate these TrBks in the output stream a'$_i$ relating to the TrCH i.

A particular non-restrictive embodiment of the invention associated with HSDPA ("High Speed Downlink Packet Access") functionality will now be considered. A full description of this functionality can be found in the technical specification TS 25.308, Release 5, version 5.0.0, published in September 2001 by the 3GPP.

HSDPA allows a base station to transmit data at a high rate for a set of mobile stations lying in the coverage zone of the base station. It is based on a high speed shared downlink transport channel: HS-DSCH ("High Speed—Downlink Shared Channel"). In the FDD mode to which the present description more particularly relates, this channel has the following characteristics in particular: (i) a transmission time interval (TTI) of 2 milliseconds corresponding to 3 timeslots of 666 μs; (ii) hybrid processes for requesting data retransmission of the HARQ type ("Hybrid Automatic Repeat reQuest"); and (iii) an adaptive coding and modulation mechanism. At the access network level, a specific layer of the "Medium Access Control" (MAC) protocol is located in the base station. Arrangements are hence made to offer a maximum rate on this channel. For the same reason, the HS-DSCH uses a relatively small spreading factor, equal to 16. In a given cell, and for a given scrambling code, it is possible to establish up to 15 HS-DSCH channels using orthogonal "channelisation" codes.

For an HS-DSCH channel, it is necessary to provide one or more specific shared physical control channels referred to as HS-SCCH ("High Speed—Shared Control CHannel") or SCCH-HS. The signaling information carried by the HS-SCCHs identifies the destination terminals of the blocks transmitted on the HS-DSCHs, and provides them with a certain number of indications useful for the reception of these blocks:

a "Transport Format and Resource Indicator" (TFRI), giving the information concerning the format of the dynamic part of the HS-DSCH channel, in particular for the modulation scheme being employed, and the allocated physical resources ("channelisation" codes);

the information associated with the HARQ protocol, in particular the redundancy version, a HARQ process identifier, and an indicator of new data blocks.

An HS-SCCH channel uses a spreading factor of 128, with a TTI identical to that of the HS-DSCH (3 slots of 666 μs). All the HS-PDSCHs (that is to say the physical channels coming from the HS-DSCHs) within a cell are aligned in time and the synchronization of the HS-SCCHs is advanced by two slots (1333 μs) in relation to that of the associated HS-PDSCHs, which allows the destination terminal of a data block transmitted on an HS-PDSCH in an HSDPA TTI of 2 ms to find out the information necessary for its reception. Certain information contained in the TFRI, namely the allocated codes as well as the modulation being used, are indispensable for the terminals because they allow them to start demodulating the HS-PDSCH or the HS-PDSCHs which concern them. This is why the TFRI is included in the first slot of each TTI on the HS-SCCH. Fast decoding of the HS-SCCH hence allows a terminal to read the content of the HS-PDSCH in the next TTI without loss of information.

The feedback information returned by the terminal, in particular for the acknowledgments of the HARQ protocol and for the measurements useful for the adaptive modulation, are transmitted by a dedicated uplink resource, on a channel referred to as DPCCH-HS ("Dedicated Physical Control CHannel—High Speed").

When the HS-DSCHs and HS-SCCHs are being established, the "Radio Network Controller" (RNC) supervising the base station allocates the corresponding code resources thereto, for each cell. By way of example, provision may be made to reserve up to 16 codes with a spreading factor of 128 for the HS-SCCHs.

When an HSDPA session is open for a given terminal, the RNC indicates to it, as well as to the base station, a certain number of HS-SCCH codes on which the signaling information which concerns it is liable to be sent to it. This number of HS-SCCH codes lies between 1 and 4 for each terminal. It will be assumed below that it is equal to 4, without restricting the generality of the explanation.

In a typical embodiment, a terminal constantly despreads the received signal by means of the 4 HS-SCCH codes which have been indicated to it. However, in order to avoid unnecessarily burdening the resources of the terminal, it is expedient for it to decode only the HS-SCCH which concerns it as appropriate. To that end, a specific signaling is provided on the downlink, using a dedicated channel (DPCH) operating in parallel with the HS-PDSCH for this terminal.

This specific signaling includes a two-bit indicator referred to as HI ("HS-DSCH Indicator"), carried by the DPCH and indicating to the terminal that information is intended for it on an identified HS-SCCH. The two bis of the HI define four states which make it possible to distinguish which of the four HS-SCCHs is carrying information concerning the terminal as appropriate. If the HI is transmitted with a zero power (which constitutes a fifth state), none of the four HS-SCCHs is carrying information concerning the terminal. In the latter case, the terminal may attribute a value to the HI which leads it to decode an HS-SCCH superfluously, but it will realize this quickly because the HS-SCCH also indicates the destination terminal.

The HI intended for a terminal needs to be transmitted, read and interpreted by this terminal before the end of the first slot of the HS-SCCH, so as to provide it early enough with the information of the TFRI (allocated HS-DSCH code and modulation being used) which is necessary in order to be able to demodulate an HS-PDSCH as appropriate.

One problem posed by inserting the HI into the stream transmitted on the DPCH is that its transmission rate is high and that its recovery by the terminal must be very fast. It is necessary to provide 5 transmissions of it per frame, i.e. $5 \times F_i$ transmissions per TTI of a dedicated transport channel corresponding to this DPCH, and the terminal cannot wait to have received a complete TTI to be decoded before finding out the values of these HIs. Consequently, the HI needs to be inserted for example after stamping, or stealing, of QPSK symbols downstream of the second interleaver $30_j$. The two bits of an HI hence form a QPSK symbol substituted, at the input of the modulator, for a symbol of the sequence to be transmitted. This substitution merely takes place in only certain slots of the frame.

Returning to FIG. 2, the function of the module 100 is to manage the HSDPA functionality in the base station. In particular, it incorporates the application of the MAC protocol useful for supervision. of the HSDPA mode. This module controls the time-division multiplexing of the transport streams for the HS-DSCH channels of the cell, which is done at a rate of one stream per terminal and per TTI on a given code, on the basis of the information streams received from the RNC by the multiplexing module 102 represented in FIG. 2. The signals transmitted on the corresponding HS-PDSCH physical channel or channels are spread and modulated in the block 3, by applying the specified adaptive modulation scheme as appropriate (modules 103), then combined by the module 84 with those of the other physical channels in order to be sent to the radio stage 4 and transmitted on the radio channel, as explained above.

The HSDPA management module 100 takes into account the feedback information UL returned by the terminals on the uplink in order to organize the planning of the HARQ blocks as well as the adaptation of the modulation for each TTI of the HS-DSCH. The module 100 furthermore controls the transmission on the HS-SCCH transport channels, the number of which is 16 for a cell being managed by the base station in the example depicted. The corresponding signals are coded by the modules 105 on the basis of the information specified by the module 100 (identification of the terminals, TRFI, HARQ information, etc.). These signals are spread and modulated in the block 3 (modules 106), then combined by the module 84 with those of the other physical channels.

The HSDPA management module 100 also controls the transmission of the HI by stealing symbols on the QPSK symbol streams provided to the modulators of the DPCHs, before these are modulated in the block 3. The HI is inserted by means of a multiplexer 108, placed downstream of the multiplexing block 2 described above with reference to FIG. 4, on the symbol stream relating to a PhCH used by the terminal.

For each user for which an HSDPA block is intended, the module 100 selects:

(1) an HS-PDSCH code and a TTI next available on this code for receiving the block;

(2) an HS-SCCH code, out of the four which are possible for the user, having an available TTI with a lead of two slots over the TTI of the HS-PDSCH channels, and therefore in particular of the one selected in step (1).

The module 100 then determines the information to be transmitted in the available TTI on the chosen HS-SCCH, and instructs the corresponding module 105 accordingly. It finally positions the HI as a function of the HS-SCCH code selected in step (2) and causes this HI to be inserted into the symbols transmitted on the dedicated channel, with a lead over the TTI of the HS-SCCH channel which is just sufficient (for example at most one slot ahead).

The lower part of FIG. 3 shows the inverse operations performed in a receiver terminal. At the output of the demodulator 92 operating on the PhCH on which the HI is inserted, a demultiplexer 110 extracts the QPSK symbol corresponding to the HI at the appropriate times and provides it to an evaluation module 111. The latter controls a selector 112 as a function of the value of the HI, in order to select one of the four output streams of the despreading modules 94 of the block 7, to which the codes of the four HS-SCCHs indicated by the RNC for the terminal have been allocated. Only the selected stream is then demodulated and decoded by the module 113 in order to obtain the signaling information transported by the HS-SCCH. This signaling information is provided to a module 115 for managing the HSDPA mode in the terminal, which derives therefrom the parameters necessary for operation:

of the despreading module or modules 95 of the block 7 to which the HS-DSCH codes signaled on the HS-SCCH are allocated;

of the demodulation and decoding module 116 which receives the corresponding stream of despread symbols and which applies the appropriate reception processing while providing the required feedback information (acknowledgement, etc.).

The HSDPA management module 115 formulates the signals UL to be returned on the uplink DPCCH to the base station of the cell on the basis of the feedback information obtained by the module 116.

Stealing bits at a fixed position every three slots, in order to insert the symbol containing the HI therein, may pose a problem of degradation of the signal carried by the DPCH channel after decoding by the terminal. The two deinterleaving steps $51_j$, $46_i$ performed in the terminal modify the position of the received symbols $r'_j$, so that bits which are far apart from one another in the transmitted slots may become grouped after deinterleaving. This grouping entails the risk of having stamped a plurality of consecutive information bits (up to 4 bits), and therefore leads to a significant degradation of the performances of the channel decoding $43_i$.

Figure 6:
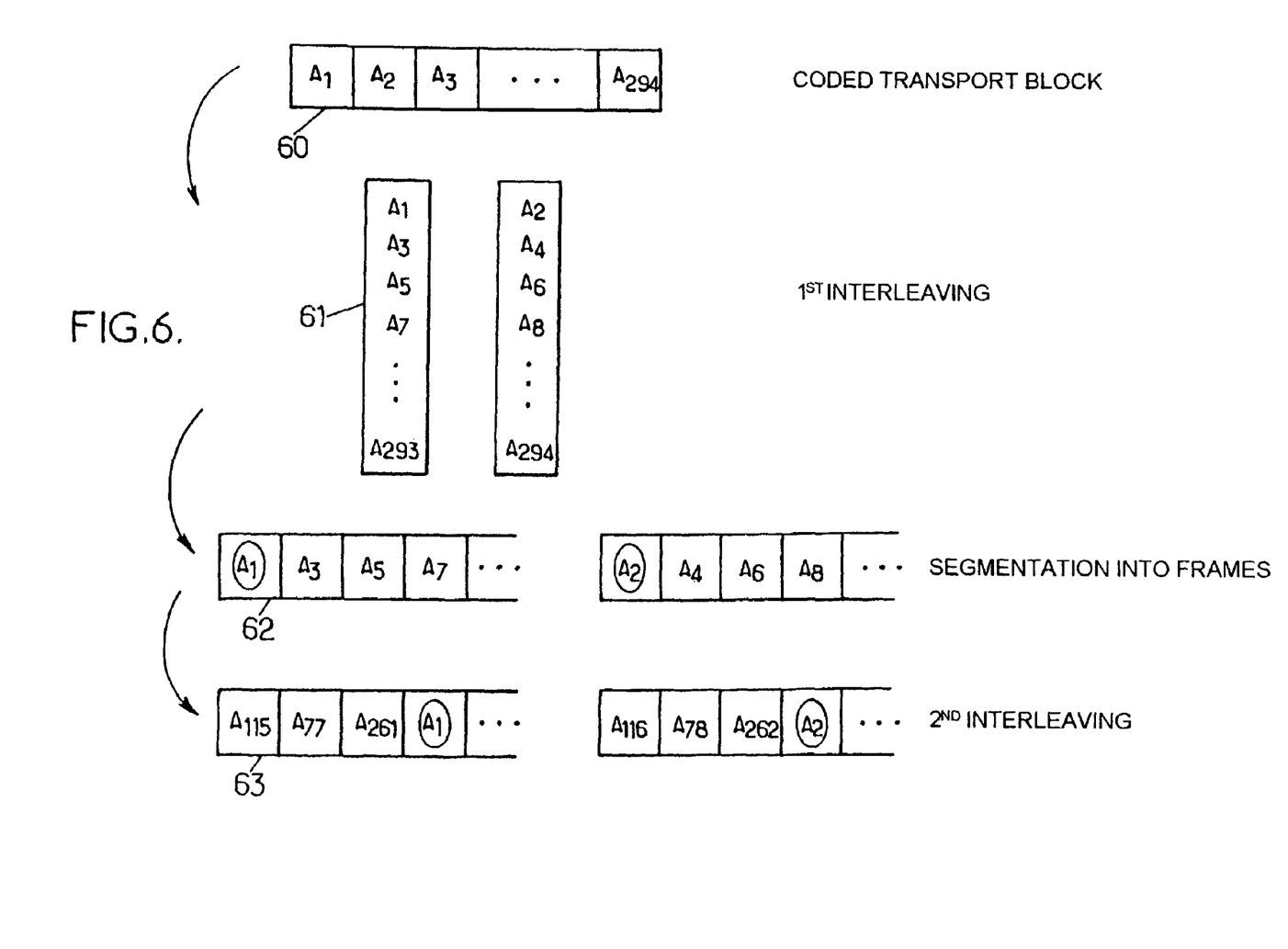
FIG. 6 is a simplified diagram indicating the operation of the first interleaver in a UMTS radio network.

FIG. 6 shows an example of a transport block 60 containing 294 bits, denoted $A_1, A_2, A_3, \ldots, A_{294}$, after channel coding $23_i$ and rate matching $24_i$. According to what was described above, the interleaving module $26_i$ in the base station performs an interleaving operation on this transport block 60. This equates to writing the bit sequence of the transport block 60 by rows into a matrix with two columns 61. The choice of the number of columns (two in the present case) is dependent on the TTI of the transport block 60. A TTI of 20 milliseconds is assumed in the example being explained, so that the transport block 60 will be divided in two when framing the transmitted bit stream ($F_i=2$). The interleaving operated by the module $26_i$ then consists in reading the initial bit sequence in the order of the columns of the matrix 61, starting with the second column.

During the segmentation of the radio frames performed by the module $27_i$, frames 62 as represented in FIG. 6 are then obtained. The first frame of the TTI contains the odd bits of the initial bit sequence of the transport block 60, while the second frame contains the even bits of this bit sequence. It is therefore apparent in this figure that initially adjacent bits of the sequence contained in the block 60, such as $A_1$ and $A_2$, are located at identical positions in each of the two frames formed after the segmentation into frames. The permutation applied by the second interleaver $31_j$ is subsequently the same for each frame (irrespective of the details of this permutation), so that the two consecutive symbols $A_1$, $A_2$ will again be located at identical positions after this second interleaver $31_j$ (frames 63 in FIG. 6): it will then form part of QPSK symbols with the same rank in two consecutive radio frames. If the QPSK symbol having this rank is lost owing to the insertion of an HI into the first frame, the same will be true of the one having the same rank in the next frame because of the stamping carried out at a fixed position 15 slots later, i.e. with a shift of 5 TTIs of the HS-SCCH. It can hence be seen that neither of the two consecutive symbols $A_1$, $A_2$ will be received by the terminal; which reduces the performances of the decoder.

FIG. 6 therefore shows that, when $F_i>1$, the characteristics of the first interleaver $26_i$ mean that substitution of the HI at fixed positions in the slots degrades the reception of the information on the dedicated channel.

Figure 7:
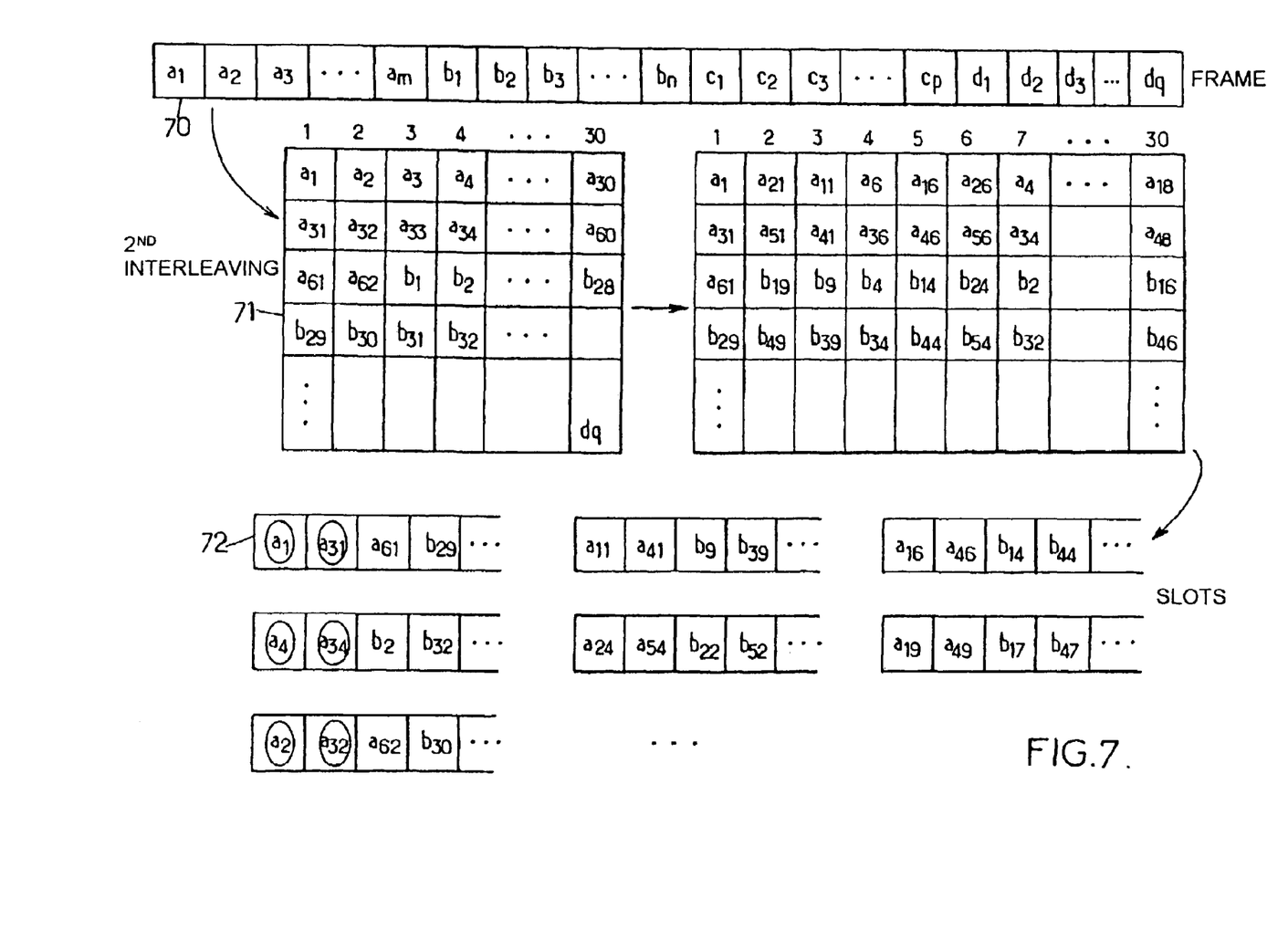
FIG. 7 is a simplified diagram indicating the operation of the second interleaver in a UMTS radio network.

FIG. 7 in turn illustrates the structure of the second interleaver $31_j$. FIG. 7 presents a frame 70 to be transmitted on a DPCH channel, consisting of information bits after multiplexing of the transport channels (and segmentation per PhCH if Y>1). This frame 70 is composed of a plurality of groups of bits, respectively coming from different transport channels (TrCHs), concatenated by the module 28 in FIG. 4. These TrCHs correspond, for example, to categories of bits with variable importance, coming from a speech coder of the AMR type ("Adaptive Multi-Rate"). It is hence possible to distinguish a first group of bits $a_1, a_2, a_3, \ldots, a_m$ pertaining to a TrCH A, a second group of bits $b_1, b_2, b_3, \ldots, b_n$ pertaining to a TrCH B, a third group of bits $c_1, c_2, c_3, \ldots, c_p$ pertaining to a TrCH C, and a fourth group of bits $d_1, d_2, d_3, \ldots, d_q$ pertaining to a TrCH D. The succession of these groups of bits results from the multiplexing of the transport channels by the module 28 within a frame of 10 milliseconds.

The intra-frame interleaving operated by the module $31_j$ equates to writing the bits of the frame 70 by rows into a matrix 71 with C2=30 columns. The module $31_j$ then reads the matrix 71, column by column, after permutation of the 30 columns of this matrix. The resulting bit stream is then positioned in the slots to be transmitted on the physical channels, at a rate of two bits per QPSK symbol. Since the number of columns in the matrix 71 (C2=30) is two times the number of slots per frame (N=15), the symbols of a slot correspond to two adjacent columns of the matrix after permutation of the columns. The lower part of FIG. 7 shows the content of the first seven slots 72 of the frame in a case in which there are m=62 bits in the TrCH A. If a QPSK symbol with the same position is stamped every three slots (for example the first symbol, corresponding to the first two bits which are circled in the lower part of FIG. 7), it can be seen that this will almost always affect the bits coming from the same TrCH, namely the TrCH A in the example depicted, from which the bits $a_1, a_{31}, a_4, a_{34}, a_2, a_{32}, a_5, a_{35}, a_{13}, a_{43}$ will be lost.

FIG. 7 therefore shows that the slots formed in this way do not make it possible to distribute the bits randomly as a function of their source TrCH. This results in a considerable processing imbalance between the TrCHs, which can only degrade the service quality.

Furthermore, in the TrCH or TrCHs thus compromised, the probability of stamping two adjacent bits in the output stream of the channel coder $23_i$ is increased. This negative effect is accentuated by the one demonstrated by the illustration in FIG. 6, when there are a plurality of frames in the TTI.

In order to overcome these drawbacks, the position of the symbols which are stamped and replaced by HIs is varied from one slot to another. This results in:

better distribution of the stamped bits between the TrCHs when the PhCH includes contributions of a plurality of TrCHs (cf. FIG. 7);

better distribution of the stamped bits in the output stream of the channel coder $23_i$, when there are a plurality of frames per TTI, that is to say when $F_i>1$ (cf. FIG. 6).

Very many choices for a variable position of the stamped bits in the frames and the slots may be made in order to satisfy these criteria. Two nonlimiting examples are presented below.

Figure 8:
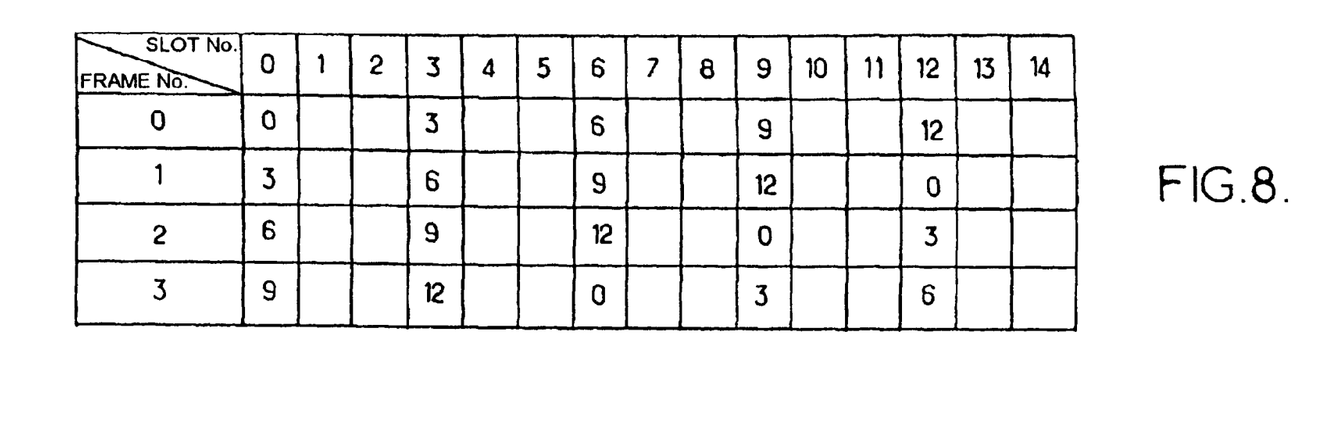
FIG. 8 is an example of stamping implemented by the invention in the context of HSDPA.

FIG. 8 shows an example of such a function for distributing the stolen symbols in the case of a TTI of 40 ms ($F_i=4$). It represents a table indicating, for the four data frames indexed from 0 to 3, the number of the QPSK symbol stolen in each slot transmitted by the base station. In this example, the positions of the five stolen symbols are the same from one frame to another, but are not applied to the same slots. For instance, the symbols stolen in the first frame respectively have the positions 0, 3, 6, 9 and 12 in the slots numbered 0, 3, 6, 9 and 12. This avoids the problem mentioned above with reference to FIG. 7 relating to the processing imbalance of the multiplexed TrCHs. For the next frame, a cyclic permutation is applied to these symbol positions, so that the symbols with positions 3, 6, 9, 12 and 0 are respectively stolen in the slots numbered 0, 3, 6, 9 and 12. The cyclic permutation set applied to determine the stamping positions in the subsequent frames. This cyclic permutation avoids the problem mentioned above with reference to FIG. 6 relating to the performance degradations of the channel decoder which are due to the first interleaver when $F_i>1$. In the intermediate slots numbered 1, 2, 4, 5, 7, 8, 10, 11, 13 and 14, no QPSK symbol is stolen in this example. This is explained, in the application case of stealing a symbol in order to transmit the indicator HI to the mobile terminal, by the fact that this indicator is to be transmitted on one QPSK symbol (i.e. two information bits) every three slots of the DPCH channel which carries it, according to what was described above. For the next four frames, the position of the stolen symbols follows the same scheme as for the first four frames which are represented.

Figure 9:
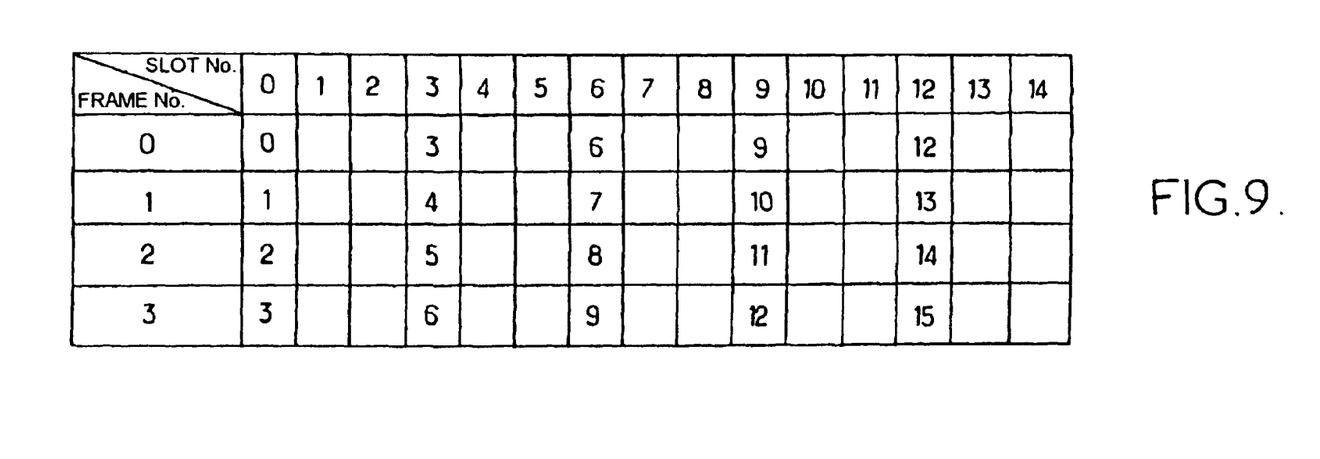
FIG. 9 is another example of stamping implemented by the invention in the context of HSDPA.

FIG. 9 presents another example of a function which allows a distribution of the stolen data symbols that does not significantly degrade the demultiplexing and the decoding of the data upon reception by the mobile terminal. In this second example of a function, the position of the stolen symbols is not preserved from one frame to the next, but is translated by one symbol for each slot. For instance, the positions of the QPSK symbols stolen to insert the indicator HI bear the numbers 0, 3, 6, 9 and 12, respectively in the slots 0, 3, 6, 9 and 12 of the first frame, as in the example in FIG. 8. The symbols stolen in the same slots of the next frame have the positions 1, 4, 7, 10 and 13, and so on if $F_i>2$.

It should be noted that any other distribution of the positions making it possible to choose the information symbols at which specific information, such as the indicator HI, is to the substituted will generally have advantages over a "fixed" solution consisting in always choosing the same symbol positions in the same slots for each of the frames containing the transmitted information. The above examples are therefore not exhaustive. As regards the examples schematized in FIGS. 8 and 9, simulations have shown that the degradation induced by stealing information symbols, in particular concerning the bit error rate observed at the reception level, is substantially cancelled out by using such a distribution of the positions of the stamped symbols.

In practice, the pattern according to which the position of the HI is varied in the successive slots which include it may be a predetermined pattern, such as the one illustrated by FIG. 8 or 9, recorded once only at the start in the transmitter and the receiver. It is also possible to provide a plurality of possible patterns, for example ones suited to different configurations of multiplexing the X TrCHs over the Y PhCHs, and to select one of these patterns as a function of the configuration encountered. The information about the pattern which is adopted is then transmitted to the terminal on a signaling channel.

Preferably, the QPSK symbol or symbols corresponding to the HI, which are distributed with variable positions between the timeslots, are transmitted by the base station with a higher transmission power than the other information symbols $r_j$, except when no HS-SCCH concerns the destination terminal of the dedicated channel (in which case these symbols are transmitted with a zero power). In this case, the destination terminal can read these symbols reliably before decoding the received information streams, limiting the risk of obtaining erroneous information.

Of course, the invention is not limited to the application cases described above by way of illustration. In particular, additional information other than the indicator HI may be transmitted by means of the mechanism of stealing symbols at variable positions which has been described, and which makes it possible to minimize the degradations entailed in the performances of the receiver. By way of example, the case of a data field of the TPC type ("Transmit Power Control") may be mentioned, which can be used for slaving the transmission power of the terminal on the DPCCH-HS uplink signaling channel used to return the signaling required by an HS-PDSCH channel to the base station.

The method according to the invention is furthermore applicable to systems other than HSDPA or UMTS.

The invention claimed is:

1. A method for digital communication, the method comprising:
   generating a sequence of digital symbols;
   assigning the symbols of the sequence to respective positions in successive timeslots, according to a predetermined slot format;
   in a plurality of timeslots, replacing at least one symbol of the sequence by a substitution symbol carrying additional information; and
   transmitting, on a communication channel, a signal representing the sequence of symbols which is distributed in the timeslots, in which the generating of the sequence includes at least one interleaving having an interleaving period longer than a timeslot, and in which the position of the substitution symbols in the slots where symbols of the sequence are replaced is varied.

2. The method according to claim 1, in which the generating of the sequence includes at least one channel coding operated before the interleaving, each digital symbol of the sequence being associated with at least one coded symbol at the output of the channel coding, and in which the position of the substitution symbols from one slot to another slot in the interleaving period is chosen so as to disperse, at the output of the channel coding, the coded symbols associated with the symbols replaced by the substitution symbols.

3. The method according to claim 1, in which the interleaving period includes at least one frame subdivided into a determined number of successive timeslots.

4. The method according to claim 3, in which each frame is subdivided into fifteen successive timeslots, and in which one slot in every three includes a substitution symbol.

5. The method according to claim 3, in which the generating of the sequence includes at least one channel coding operated at the scale of the interleaving period, followed by a first interleaving operated at the scale of the interleaving period then by a second interleaving operated at the scale of the frames.

6. The method according to claim 3, in which the interleaving period includes $F_1$ frames, where $F_1$, is a number greater than 1, and in which the generating of the sequence includes at least one channel coding, followed by an inter-frame interleaving which assigns each symbol with position $n=(\alpha-1).F_l+\beta$ at the output of the channel coding to an $\alpha$-th position of a frame of the interleaving period defined by the integer $\beta$, $\alpha$ and $\beta$ being integers such that $\alpha \geq 1$ and $1 \leq \beta \leq F_l$.

7. The method according to claim 3, in which the generating of the sequence includes an interleaving operated at the scale of the frames, and in which each frame includes, before said interleaving, a plurality of groups of concatenated symbols respectively coming from different transport channels multiplexed on said communication channel, each of said transport channels having a respective interleaving period composed of an integer number of frames.

8. The method according to claim 3, in which the generating of the sequence of symbols includes an intra-frame interleaving which assigns each symbol of rank $n=(\alpha-1).C2+\beta$ of an input frame to an $(\epsilon.R2+\alpha)$-th position of a $\gamma$-th slot of the frame, C2 being two times the number of slots per frame, R2 being the smallest integer such that R2×C2 is at least equal to the number of symbols of the input frame, $\alpha$ and $\beta$ being integers such that $1 \leq \alpha \leq R2$ and $1 \leq \beta \leq C2$, $\epsilon$ being equal to 0 or 1, and $\gamma$ being an integer such that $2.(\gamma-1)+\epsilon$ is obtained as a function of $\beta-1$ by a determined permutation over the integers contained between 0 and C2−1.

9. The method according to claim 1, in which said communication channel is a radio channel with spectral spreading.

10. The method according to claim 1, in which at least some of the substitution symbols are transmitted on the communication channel with a higher transmission power than the other symbols of the sequence.

11. The method according to claim 1, in which the substitution symbols have a status in which they are transmitted on the communication channel with a substantially zero transmission power.

12. The method according to claim 1, in which at least one signaling channel is provided, the reading of which is optional for at least one receiver and having a transmission time interval shorter than a transmission time interval of said sequence of digital symbols, and in which the signaling information carried by at least one substitution symbol instructs the receiver to read at least one signaling channel over a transmission time interval of said signaling channel.

13. The method according to claim 12, in which at least one high speed downlink shared communication channel is furthermore provided, having a transmission time interval shorter than the transmission time interval of said sequence of digital symbols, and in which the signaling channel is used for transmitting information for reading by at least one receiver over a transmission time interval of said high speed downlink shared communication channel.

14. A transmission device for a digital communication system, comprising:
means for generating a sequence of digital symbols;
means for assigning the symbols of the sequence to respective positions in successive timeslots, according to a predetermined slot format;
substitution means for replacing, in a plurality of timeslots, at least one symbol of the sequence by a substitution symbol carrying additional information; and
means for transmitting, on a communication channel, a signal representing the sequence of symbols which is divided into the timeslots, in which the means for generating the sequence include at least one interleaver having an interleaving period longer than a timeslot, and in which the substitution means are designed to vary the position of the substitution symbols in the slots where symbols of the sequence are replaced.

15. A transmission device according to claim 14, in which the means for generating the sequence include at least one channel coder, each digital symbol of the sequence being associated with at least one coded symbol at the output of the channel coder, and in which the position of the substitution symbols from one slot to another slot is chosen so as to obtain a dispersion, at the output of the channel coder, of the coded symbols associated with the symbols replaced by the substitution symbols.

16. A transmission device according to claim 14, in which the interleaving period includes at least one frame subdivided into a determined number of successive timeslots.

17. A transmission device according to claim 16, in which each frame is subdivided into fifteen successive timeslots, and in which one slot in every three includes a substitution symbol.

18. A transmission device according to claim 16, in which the means for generating the sequence include at least one channel coder operating at the scale of the interleaving period, followed by a first interleaver operating at the scale of the interleaving period then by a second interleaver operating at the scale of the frames.

19. A transmission device according to claim 16, in which the interleaving period includes $F_i$ frames, where $F_i$ is a number greater than 1, and in which the channel coder is followed by an inter-frame interleaver which assigns each symbol with position $n=(\alpha-1).F_i+\beta$ at the output of the channel coding to an $\alpha$-th position of a frame of the interleaving period defined by the integer $\beta$, $\alpha$ and $\beta$ being integers such that $\alpha \geq 1$ and $1 \leq \beta \leq F_i$.

20. A transmission device according to claim 16, in which the means for generating the sequence include an interleaver operating at the scale of the frames, and in which each frame includes, before said interleaver, a plurality of groups of concatenated symbols respectively coming from different transport channels multiplexed on said communication channel.

21. A transmission device according to claim 20, in which the means for generating the sequence furthermore include, for each of said transport channels, a first interleaver having a respective interleaving period composed of an integer number of frames.

22. A transmission device according to claim 16, in which the means for generating of the sequence include an intra-frame interleaver which assigns each symbol of rank $n=(\alpha-1).C2+\beta$ of an input frame to an $(\epsilon.R2+\alpha)$-th position of a $\gamma$-th slot of the frame, C2 being two times the number of slots per frame, R2 being the smallest integer such that R2×C2 is at least equal to the number of symbols of the input frame, $\alpha$ and $\beta$ being integers such that $1 \leq \alpha \leq R2$ and $1 \leq \beta \leq C2$, $\epsilon$ being equal to 0 or 1, and $\gamma$ being an integer such that 2. $(\gamma-1)+\epsilon$ is obtained as a function of $\beta-1$ by a determined permutation over the integers contained between 0 and C2−1.

23. A transmission device according to claim 14, in which said communication channel is a radio channel with spectral spreading.

24. A transmission device according to claim 14, in which the means for transmitting transmit at least some of the substitution symbols with a higher transmission power than the other symbols of the sequence.

25. A transmission device according to claim 14, in which the means for transmitting transmit substitution symbols having a determined status with a substantially zero transmission power.

26. A transmission device according to claim 14, furthermore comprising means for transmitting on at least one signaling channel whose reading is optional for at least one receiver, with a transmission time interval shorter than a transmission time interval of said sequence of digital symbols, in which the signaling information carried by at least one substitution symbol includes an instruction intended for the receiver to read at least one signaling channel over a transmission time interval of said signaling channel.

27. A transmission device according to claim 26, furthermore comprising means for transmitting on at least one high speed downlink shared communication channel with a transmission time interval shorter than the transmission time interval of said sequence of digital symbols, in which the means for transmitting on the signaling channel are arranged for transmitting information for reading by at least one receiver over a transmission time interval of said high speed downlink shared communication channel.

28. A reception device for a digital communication system, the reception device comprising:
means for receiving, on a communication channel, a signal representing a sequence of digital symbols which is divided into successive timeslots;
means for extracting additional information from only part of the timeslots, by reading at least one respective symbol carrying additional information in each of the timeslots of said part; and
means for processing of the sequence of symbols which is stripped of the symbols carrying additional information, the processed symbols being obtained at defined positions in the timeslots according to a predetermined slot format; in which the means for processing of the sequence include at least one deinterleaver having a deinterleaving period longer than a timeslot, and in which said extraction means are designed to read said symbols carrying additional information at variable positions from one slot to another slot in said part.

29. A reception device according to claim 28, in which the means for processing of the sequence include at least one channel decoder downstream of the deinterleaver, each digital symbol of the sequence being associated with at least one coded symbol at the input of the channel decoder, and in which the position of the symbols carrying additional information varies from one slot to another slot in said part so that, at the input of the channel decoder, the coded symbols associated with the symbols carrying additional information are not grouped.

30. A reception device according to claim 28, in which the position in the timeslots of the symbols carrying additional information varies in the deinterleaving period according to a predefined pattern.

31. A reception device according to claim 28, furthermore comprising means for receiving information describing the position of the symbols carrying additional information to be read over a plurality of timeslots in the deinterleaving period.

32. A reception device according to claim 28, in which the deinterleaving period includes at least one frame subdivided into a determined number of successive timeslots.

33. A reception device according to claim 32, in which the means for processing of the sequence include a first deinterleaver operating at the scale of the frames, followed by a second deinterleaver operating at the scale of the deinterleaving period and by a channel decoder operating at the scale of the deinterleaving period.

34. A reception device according to claim 31, in which each frame is subdivided into fifteen successive timeslots, and in which one slot in every three includes at least one symbol carrying additional information.

35. The reception device according to claim 32, in which the means for processing of the sequence include a deinterleaver operating at the scale of the frames, and segmentation means for extracting from each deinterleaved frame a plurality of groups of symbols which are respectively addressed to chains for processing of different transport channels multiplexed on said communication channel.

36. The reception device according to claim 35, in which each chain for processing of a transport channel includes a second deinterleaver operating at the scale of a respective interleaving period assigned to said transport channel.

37. The reception device according to claim 28, in which said communication channel is a radio channel with spectral spreading.

38. The reception device according to claim 28, furthermore comprising means for receiving on at least one signaling channel, with a transmission time interval shorter than a transmission time interval of said sequence of digital symbols, in which the means for reception on the signaling channel are controlled, for each transmission time interval, by the additional information carried by at least one symbol read by the means for extracting.

39. The reception device according to claim 38, furthermore comprising means for receiving on at least one high speed downlink shared communication channel having a transmission time interval shorter than the transmission time interval of said sequence of digital symbols, in which the means for receiving on the high speed downlink shared communication channel are controlled, for each transmission time interval, by the signaling information read on said signaling channel as a function of the additional information carried by at least one symbol read by the means for extracting.

* * * * *